US011239808B2

(12) United States Patent
Lee et al.

(10) Patent No.: US 11,239,808 B2
(45) Date of Patent: Feb. 1, 2022

(54) FEEDBACK AMPLIFIER AS AN IMPEDANCE MODULATOR FOR A LINEAR POWER AMPLIFIER

(71) Applicant: Avago Technologies International Sales Pte. Limited, Singapore (SG)

(72) Inventors: Seung Yub Lee, Seoul (KR); Jun Hee Oh, Seoul (KR); Un-Ha Kim, Seoul (KR); Joo Young Jeon, Seoul (KR)

(73) Assignee: Avago Technologies International Sales Pte. Limited, Singapore (SG)

( * ) Notice: Subject to any disclaimer, the term of this patent is extended or adjusted under 35 U.S.C. 154(b) by 48 days.

(21) Appl. No.: 16/666,856

(22) Filed: Oct. 29, 2019

(65) Prior Publication Data

US 2021/0126605 A1  Apr. 29, 2021

(51) Int. Cl.
| H03F 1/30 | (2006.01) |
| H03F 3/50 | (2006.01) |
| H03F 3/30 | (2006.01) |
| H03F 3/68 | (2006.01) |
| H03F 3/21 | (2006.01) |
| H03F 3/19 | (2006.01) |

(52) U.S. Cl.
CPC .............. *H03F 3/50* (2013.01); *H03F 3/211* (2013.01); *H03F 3/3027* (2013.01); *H03F 3/68* (2013.01); *H03F 3/19* (2013.01)

(58) Field of Classification Search
CPC . H03F 3/50; H03F 3/68; H03F 3/3027; H03F 3/211; H03F 3/45475; H03F 3/45183; H03F 3/45479; H03F 3/45071; H03F 1/34; H03F 3/3066; H03F 1/307; H03F 3/26; H03F 3/3096; H03F 1/302; H03F 1/347; H03F 1/30; H03F 3/343; H03F 2200/294; H03F 1/36
USPC ......... 330/85, 100, 129, 259, 260, 265, 270, 330/271, 282, 290
See application file for complete search history.

(56) References Cited

U.S. PATENT DOCUMENTS

| 4,543,536 A * | 9/1985 | Pederson ................... H03F 3/70 |
| | | 330/107 |
| 7,154,338 B2 * | 12/2006 | Chacko ................ H03G 3/3047 |
| | | 330/285 |
| 10,823,774 B2 * | 11/2020 | Steiner ................... H04R 19/04 |

* cited by examiner

*Primary Examiner* — Khanh V Nguyen
(74) *Attorney, Agent, or Firm* — Foley & Lardner LLP (57) ABSTRACT

A power amplifier and power amplification circuit are described herein. An illustrative power amplifier is disclosed to include an input terminal, a drive amplifier connected to the input terminal, and an impedance modulator having a capacitance that is adjusted inversely and proportionately relative to a signal output by the drive amplifier, wherein the impedance modulator provides a feedback loop between an output of the drive amplifier and the input terminal.

20 Claims, 9 Drawing Sheets

FEEDBACK AMPLIFIER AS AN IMPEDANCE MODULATOR FOR A LINEAR POWER AMPLIFIER

FIELD OF THE DISCLOSURE

Example embodiments are generally directed toward power amplifiers and power amplification circuits.

BACKGROUND

Advanced communication systems, such as 5G beyond 4G, are expected to be realized at wide frequency bandwidths up to 100 MHz to achieve a higher data transfer rate. However, a power amplifier faces challenging requirements to support wideband signal modulation due to its high Peak-to-Average Power Ratio (PAPR), which causes distortion of Amplitude Modulation to Amplitude Modulation (AMAM) and Amplitude Modulation to Phase Modulation (AMPM) of an output signal of the power amplifier.

BRIEF DESCRIPTION OF THE DRAWINGS

Inventive concepts are described in conjunction with the appended figures, which are not necessarily drawn to scale.

DETAILED DESCRIPTION

One technique to support the wideband signal, which has a high PAPR, is to employ an Average Power Tracking (APT), where bias voltage is adjusted according to average power. An issue associated with using APT is that a linearity of the PA and the nonlinearity of a Heterojunction Bipolar Transistor (HBT) within the PA makes AMAM distortion and the AMPM distortion at high power region, close to saturated power.

Conventionally, with the APT technique, the AMAM distortion is fairly easily improved by some methods which are controlling gain profile. However, the typical way to compensate the AMPM distortion is boosting the base voltage, Vbe, of the HBT. This can be done by increasing the bias voltage, but such an action leads to very poor efficiency which is a main problem of the APT technique for the high PAPR 5G signal.

The above-noted shortcomings associated with advanced communication systems and power amplifiers used in the same will be addressed by embodiments of the present disclosure.

Specifically, embodiments of the present disclosure provide a power amplifier that includes a pre-distortion circuit which corrects the AMPM distortion by distorting phase at the input terminal proportionately and in an opposite direction to that of original distortion.

In other words, the phase at input terminal may be configured to decrease as the power increases because a shunt capacitance can be provided at the input terminal increases as the power increases. Therefore, the phase of a driver stage may be opposite to that of a main stage and the AMPM distortion of the total PA becomes nearly zero.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of example embodiments will be described herein with reference to drawings that are schematic illustrations of idealized configurations. As such, variations from the shapes of the illustrations as a result, for example, manufacturing techniques and/or tolerances, are to be expected. Thus, the various aspects of example embodiments presented throughout this document should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of example embodiments.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "include," "includes," "including," "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Figure 1:
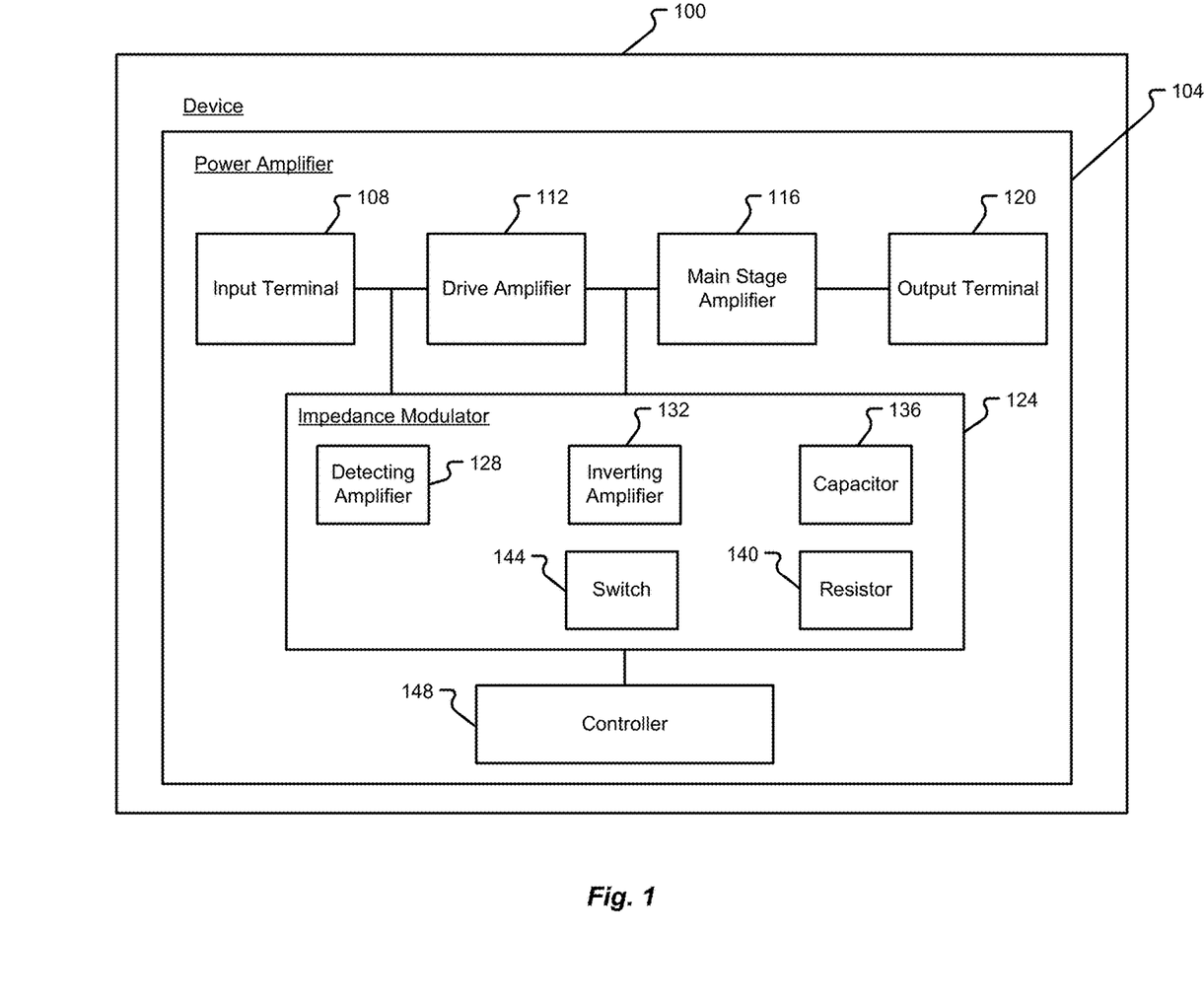
FIG. 1 is a block diagram depicting a device in accordance with at least some embodiments of the present disclosure.

Referring initially to FIG. 1, additional details of a device 100 having a power amplifier 104 will be described in accordance with at least some embodiments of the present disclosure. The device 100 may include any type of fixed or mobile communication device that is configured for wireless communications. Specifically, the device 100 may correspond to a smart phone, laptop, wearable device, tablet, mobile phone, or the like that is configured to communicate using 5G frequency bands (e.g., frequencies bands between 3 GHz and 100 GHz).

The device 100 may include a number of different components, which are not depicted. The power amplifier 104 that is shown as being included in the device 100 may correspond to a sub-system of a larger communication module or Integrated Circuit (IC) chip provided in the device 100. In some embodiments, the power amplifier 104 may be realized within a wireless communication module that is connected to a larger Printed Circuit Board (PCB) in the device 100. The wireless communication module and the power amplifier 104 may enable the device 100 to send and receive voice, video, text, and other data within defined frequency bands.

In some embodiments, the power amplifier 104 may include an input terminal 108, a drive amplifier 112, a main stage amplifier 116, and an output terminal 120. The power amplifier 104 may be considered a linear power amplifier because the driver amplifier 112 and main stage amplifier 116 are connected in a linear fashion between the input terminal 108 and the output terminal 120.

The power amplifier 104 is further shown to include an impedance modulator 124 and a controller 148 that is configured to control operations of the impedance modulator 124. In some embodiments, the controller 148 may correspond to a CMOS controller and may provide a bias voltage to the impedance modulator 124 as part of controlling operations of the impedance modulator 124. In some embodiments, the controller 148 may be configured to adjust the bias voltage provided to the impedance modulator 124 based on a temperature measured in proximity to the controller 148 (e.g., with a temperature sensor provided on or near the controller 148 or within a predetermined proximity of the controller 148). In some embodiments, the controller 148 may be configured to the control the bias voltage based on a frequency at which input signals are received at the input terminal 108. Said another way, if the input terminal 108 is receiving signals within a particular frequency band, then the controller 148 may be configured to specifically adjust the bias voltage provided to the impedance modulator 124 based on the particular frequency band. The frequency of the signal received at the input terminal 108 may be variable so, in some embodiments, the controller 148 may be configured to dynamically adjust the bias voltage provided to the impedance modulator 124 based on changes of frequency realized at the input terminal 108. Said another way, the frequency at the input terminal 108 may be variable and the controller 148 may be configured to detect such frequency changes and adjust the bias voltage provided to the impedance modulator 124.

The impedance modulator 124 is shown to provide a feedback between an output of the drive amplifier 112 and the input terminal 108. In some embodiments, the impedance modulator 124 provided as part of a pre-distortion circuit that corrects AMPM distortion by distorting phase at the input terminal 108 in a direction opposite to original distortion provided by an input signal received at the input terminal 108. The impedance modulator 124 may provide a variable capacitance at the input terminal 108 that is adjusted inversely and proportionately relative to the signal output by the driver amplifier 112.

In some embodiments, the impedance modulator 124 may include a detecting amplifier 128, an inverting amplifier 132, a capacitor 136, one or more resistors 140, and a switch 144. As will be discussed in further detail herein, these components of the impedance modulator 124 may be configured to enable functionality of the impedance modulator 124, but not all of the components are required in every instance of the impedance modulator 124. In some embodiments, the detecting amplifier 128 may be configured to receive the signal output by the drive amplifier 112 and amplify the signal output by the drive amplifier 112. The inverting amplifier 132 may be configured to receive the output from the detecting amplifier 128 (e.g., the amplified version of the signal output by the drive amplifier 112) and produce a modulated output based on the signal received from the detecting amplifier 128. The output of the inverting amplifier 132 may be provided to a capacitor 136 that is shunt connected at the input terminal 108. Outputs of the inverting amplifier 132 provided to the capacitor 136 may cause a capacitance of the capacitor 136 provided to the input terminal 108 to be adjusted inversely and proportionately relative to the signal output by the drive amplifier 112. In some embodiments, a capacitance of the capacitor 136 may be modulated based at least in part on a power input at the input terminal 108. The resistor 140 may be connected between a ground and an output of the inverting amplifier 132.

Additional details of the various components of the power amplifier 104 will now be described with reference to FIGS. 2A through 9. It should be appreciated that a power amplifier 104 may include some or all of the features depicted and described herein, but a power amplifier 104 does not necessarily need to include all of the features depicted and described herein.

Figure 2A:
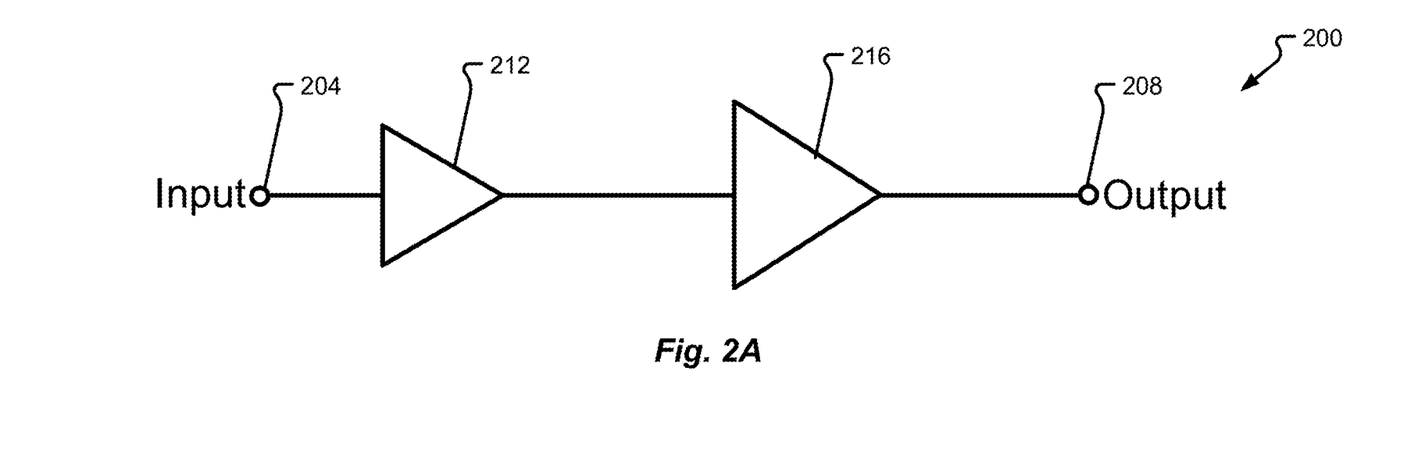
FIG. 2A is a circuit diagram depicting a power amplifier circuit.
Figure 2B:
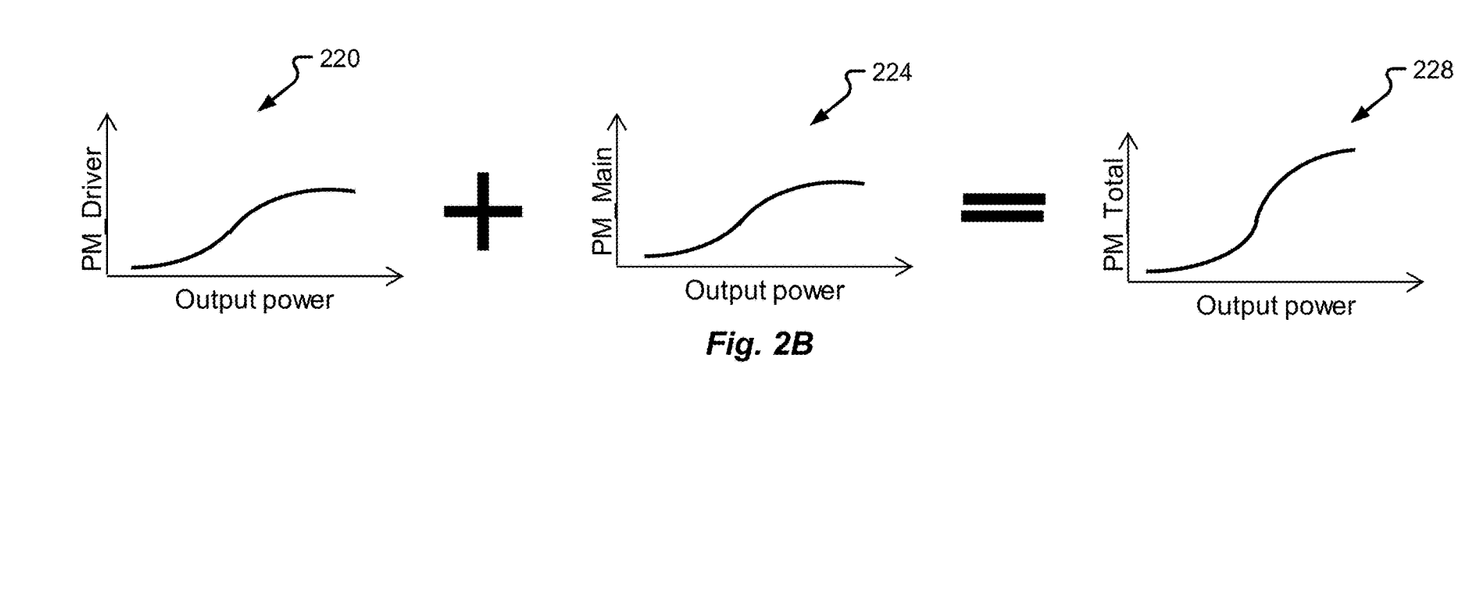
FIG. 2B illustrates behaviors of the power amplifier circuit depicted in FIG. 2A.

FIGS. 2A and 2B illustrate a circuit 200 and possible outputs of a circuit 200 that does not include an impedance modulator 124. The circuit 200 does illustrate an input terminal 204 and output terminal 208 with a drive amplifier 212 and main stage amplifier 216 connected therebetween. In this particular circuit 200, the drive amplifier 212 and main stage amplifier 216 provide two distinct signal amplification stages. The driver stage provided by the drive amplifier 212 may correspond to a sub-gain block and the main stage amplifier 216 may provide a main amplification stage for the power amplifier 104.

As shown in FIG. 2B, each active stage distorts the AMPM and the amount of distortion increases as power increases. Moreover, the total AMPM of the circuit 200 (e.g., a power amplifier 104 without an impedance modulator 124)

may correspond to a sum of the distortion of both stages. Specifically, FIG. 2B illustrates the drive amplifier phase modulation as a function of output power 220 and the main stage amplifier phase modulation as a function of output power 224. The total AMPM 228 of the circuit 200 is shown to have a larger AMPM than either amplification stage because both amplification stages distort the AMPM in a similar manner.

Figure 3A:
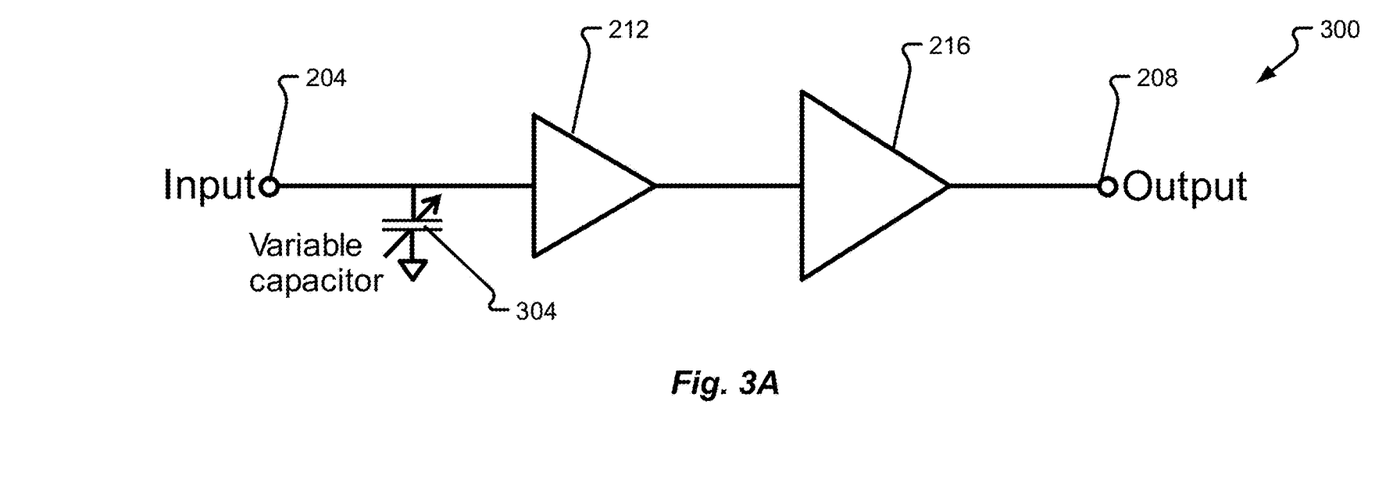
FIG. 3A is a circuit diagram depicting a power amplifier circuit in accordance with at least some embodiments of the present disclosure.
Figure 3B:
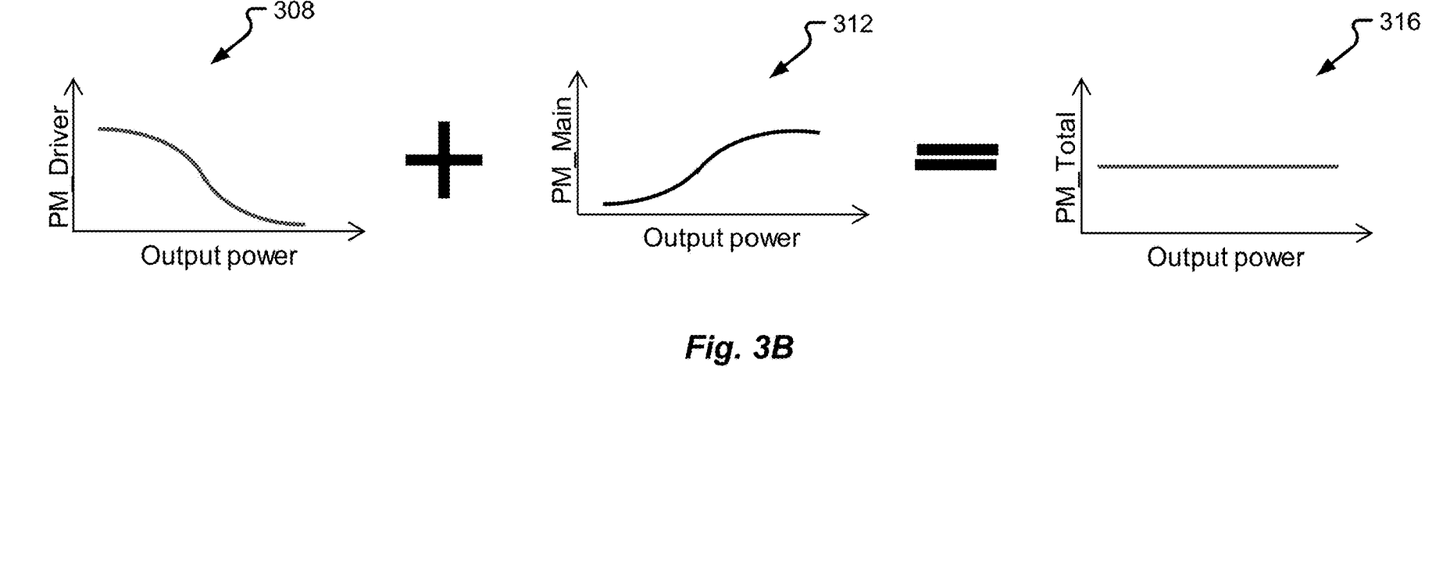
FIG. 3B illustrates behaviors of the power amplifier circuit depicted in FIG. 3A.

FIGS. 3A and 3B illustrate a circuit 300 and possible outputs of a circuit 300 that does include a variable capacitor 304. Specifically, the variable capacitor 304 may be provided by way of an impedance modulator 124 as depicted and described herein.

In some embodiments, the capacitance of the variable capacitor 304 may be configured to increase according to output power. This increase in capacitance may result in phase compensation as shown in FIG. 3B. Specifically, the drive amplifier phase modulation as a function of output power 308 may decrease while the main stage amplifier phase modulation as a function of output power 312 may increase. The distortion of the combined output 316 of the circuit 300 (e.g., the summation of the phase modulation 308 and phase modulation 312) effectively becomes zero. In other words, the variable capacitor 304 may correct the AMPM distortion of the circuit 300 by distorting the phase at the input terminal 204 in the opposite direction to that of original distortion. Thus, the phase modulation 308 at the input terminal 204 may decrease as the power increases since the shunt capacitance provided by the variable capacitor 304 to the input terminal 204 increases as the power decreases. This causes the phase modulation of the drive stage amplifier 308 to be opposite to that of the phase modulation of the main stage amplifier 312, which drives the total combined phase modulation 316 of the circuit 300 to approach zero.

Figure 4:
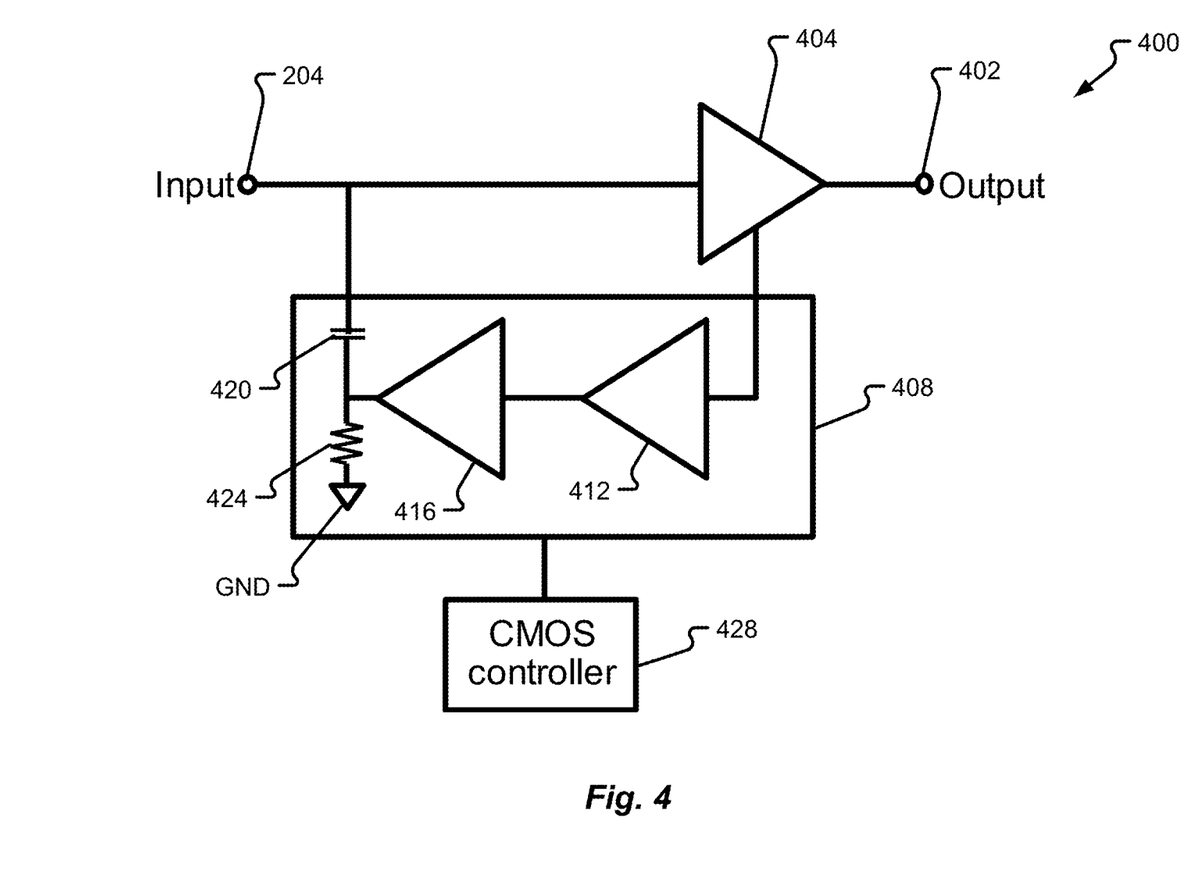
FIG. 4 is a circuit diagram depicting additional details of an impedance modulator circuit in accordance with at least some embodiments of the present disclosure.

Additional details of circuits which may be used for the impedance modulator 124 will now be described in accordance with at least some embodiments of the present disclosure. Referring initially to FIG. 4, details of a circuit 400 will be described in accordance with at least some embodiments of the present disclosure. The circuit 400 may correspond to a portion of circuit 300 where the variable capacitor 304 is provided by the impedance modulator 408. The impedance modulator 408 may be similar or identical to impedance modulator 124 and the impedance modulator 408 may provide a capacitance to the input terminal 204 that is adjusted inversely and proportionately relative to a signal output by the amplifier 404.

In some embodiments, the amplifier 404 may correspond to an example of a drive amplifier 112, 212. The impedance modulator 408 is shown as being connected directly to the amplifier 404, but the impedance modulator 408, in some embodiments, may be connected to the output 402 of the amplifier 404. The signal output by the amplifier 404 may be provided as an input to the impedance modulator 408, which initially receives the signal at the detecting amplifier 412. In some embodiments, the detecting amplifier 412 may be similar or identical to the detecting amplifier 128. The output 402 may also correspond to an input of the main stage amplifier 116, 216.

The detecting amplifier 412 may be configured to receive/detect the signal output by the amplifier 404 and amplify the signal output by the amplifier 404 into an amplified signal. The output of the detecting amplifier 412 (e.g., the amplified version of the signal output by the amplifier 404) may be provided directly to the inverting amplifier 416, which modulates the signal received from the detecting amplifier 412. The inverting amplifier 416 may be similar or identical to inverting amplifier 132.

The output of the inverting amplifier 416 may be provided between a capacitor 420 and resistor 424 that is connected to ground GND. It should be appreciated that ground GND may correspond to an absolute ground (e.g., electrical potential equal to zero) or a relative ground. The potential at ground GND may float or be fixed.

The CMOS controller 428 is shown to provide a control signal to the impedance modulator 408. The CMOS controller 428 may correspond to one example of a controller 148. In some embodiments, the CMOS controller 428 may comprise digital circuit elements (e.g., transistors) that enable the CMOS controller 428 to generate and adjust a bias voltage provided to the impedance modulator 408. The CMOS controller 428 may adjust the bias voltage based on a measured frequency of a signal received at the input terminal 204, based on an expected frequency of a signal received at the input terminal 204, based on a temperature on or around the CMOS controller 428, based on a temperature on or around the impedance modulator 408, or combinations thereof.

Figure 5:
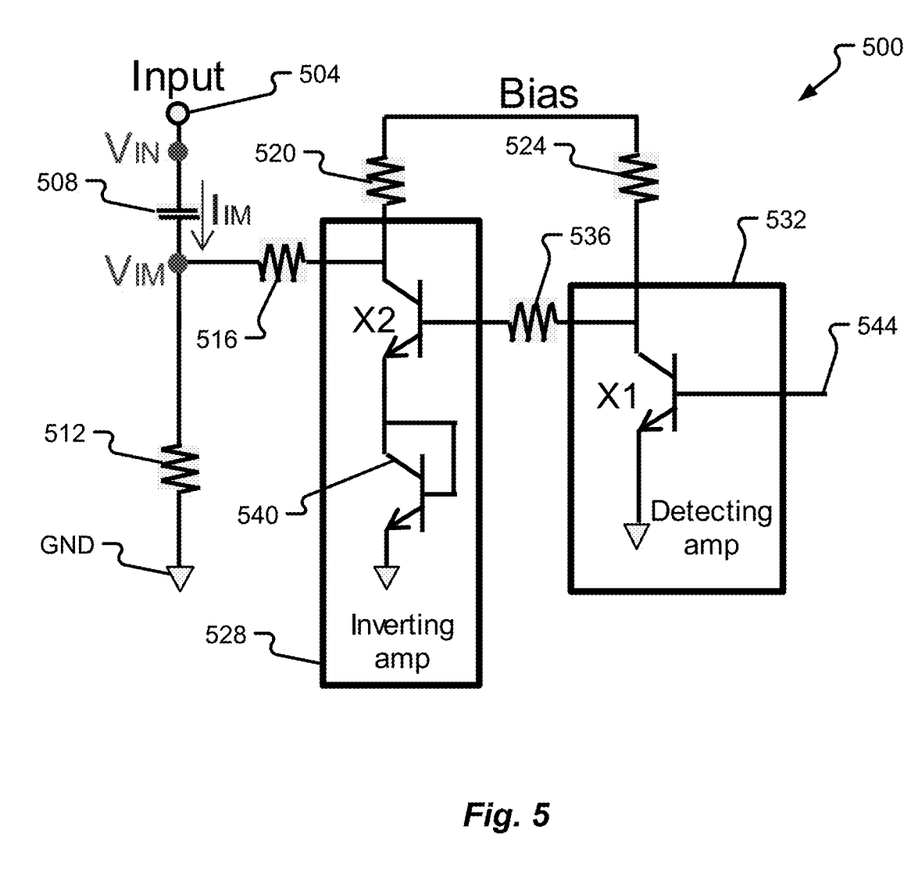
FIG. 5 is a circuit diagram depicting additional details of an impedance modulator circuit in accordance with at least some embodiments of the present disclosure.

Referring now to FIG. 5, additional details of the impedance modulator 408 will be described in accordance with at least some embodiments of the present disclosure. Specifically, FIG. 5 illustrates a circuit 500 in which the bias voltage is shown between the detecting amplifier 532 and the inverting amplifier 528. It should be appreciated that the detecting amplifier 532 may be similar or identical to any other detecting amplifier (e.g., amplifiers 128, 412) depicted and described herein. Likewise, it should be appreciated that the inverting amplifier 528 may be similar or identical to another other inverting amplifier (e.g., amplifiers 132, 416) depicted and described herein.

The circuit 500 illustrates an input terminal 504, which may be similar to input terminal 204. Circuit 500 also illustrates a capacitor 508 and resistor 512, which may be similar or identical to capacitors 136, 420 and resistors 140, 424, respectively. The detecting amplifier 532 is shown to receive an impedance modulator input 544, which may correspond to an output of the drive amplifier 212. The detecting amplifier 532 includes at least a first transistor X1. The inverting amplifier 528 is shown to be connected to the detecting amplifier 544 through resistor 536 and one or more bias resistors 520, 524. These resistors 520, 524, 536 may correspond to actual resistors and/or an inherent resistance of a conductive wire or trace positioned between the detecting amplifier 532 and inverting amplifier 528. In the detected embodiment, the inverting amplifier 528 may include transistor X2 and transistor 540 that are connected to one another.

The transistor X1 of the detecting amplifier 532 is shown to have the base connected to input 544, the emitter connected to ground, and the collector connected to the base of transistor X2 provided in the inverting amplifier 528. The emitter of the transistor X2 may be connected directly to the collector of transistor 540 while the collector of the transistor X2 may be connected to the output of the inverting amplifier 528, which may be connected to VIM through resistor 516. In some embodiments, the bias voltage provided by the controller (e.g., controller 148 or CMOS controller 428) may be on the order of 3V. It should be appreciated, however, that the bias voltage may vary anywhere between 1V and 4V without departing from the scope of the present disclosure.

An operation theory of the power dependent variable capacitor 304 may be provided by the circuitry connected to the capacitor 508. Additional details of the operation of the circuit 500 will now be described in accordance with at least some embodiments of the present disclosure and with reference to the following equations:

$$\frac{I_{IM}}{V_{IN} - V_{IM}} = \frac{I_{IM}}{V_{IN}(1-A)} = j\omega C_{IM}, \quad V_{IM} = A \times V_{IN} \quad \text{(Equation 1)}$$

$$1 - A = k_1 - jk_2 \quad \text{(Equation 2)}$$

$$\frac{I_{IM}}{V_{IN}} = j\omega C_{IM}(1-A) = j\omega C_{IM}k_1 + \omega C_{IM}k_2 \quad \text{(Equation 3)}$$

In particular, the admittance in terms of a capacitor 508 $C_{IM}$, VIN, and VIM, which are the voltage at each node of the capacitor 508 respectively, and the current through the capacitor 508, IIM. The VIM can be expressed in terms of a voltage gain, A, and the input voltage, VIN. And the term (1-A) in (Equation 1) can be expressed as a complex number in terms of coefficients $k_1$ and $k_2$ as (Equation 2). By (Equation 1 and Equation 2), the input admittance of the impedance modulator circuit 500 can be expressed as (Equation 3). The imaginary part of the admittance in (Equation 3) is a reactance of the circuit 500 which is proportional to the coefficient $k_2$ which is related to the voltage VIM. As a result, the input capacitance ($C_{IM}$) of the circuit 500 varies according to the power since the VIM changes according to the power. The effectively means that the circuit 500 is configured to provide a variable capacitance in accordance with at least some embodiments of the present disclosure.

Figure 6A:
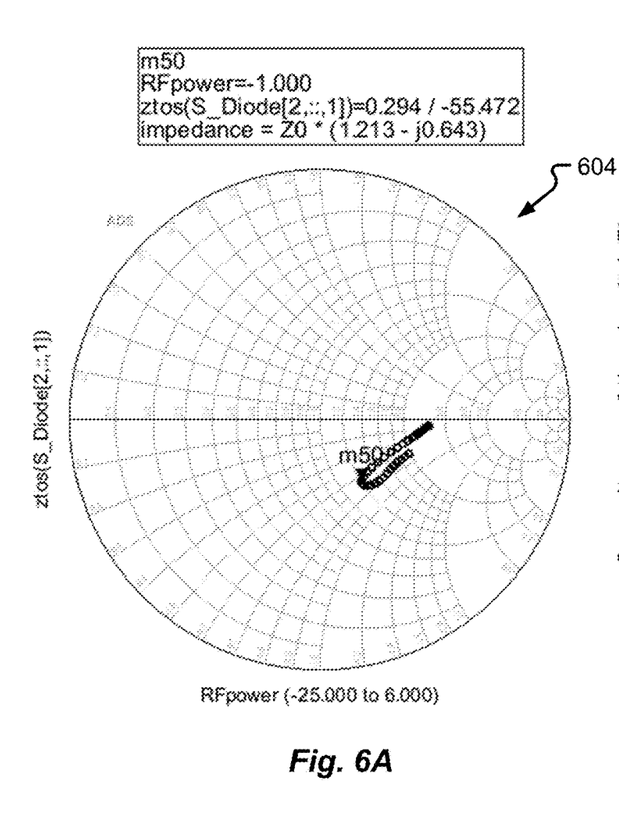
FIG. 6A depicts a simulation result of the input impedance of an impedance modulator circuit in accordance with at least some embodiments of the present disclosure.
Figure 6B:
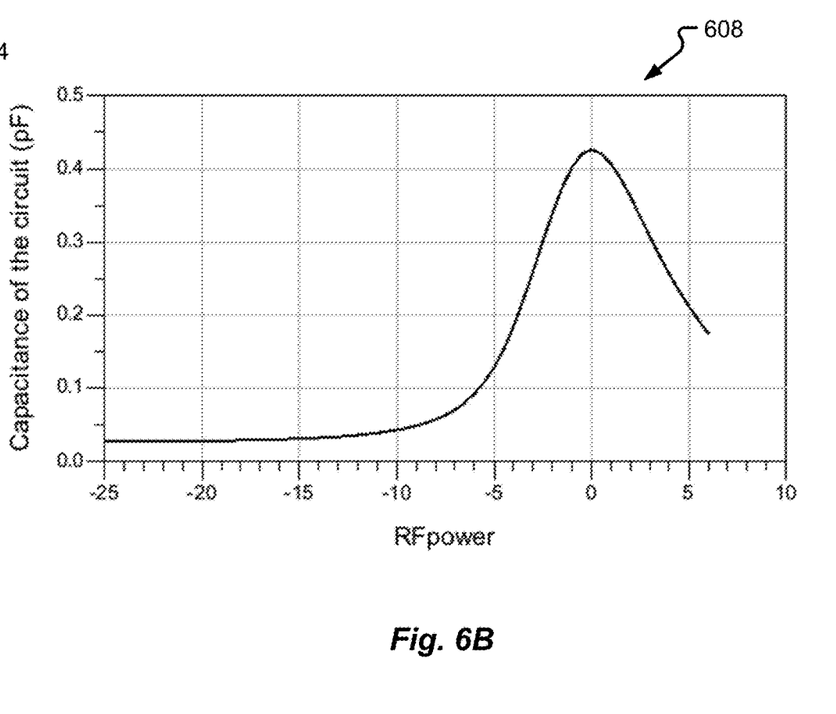
FIG. 6B depicts an input capacitance of a circuit that is modulated according to power in accordance with at least some embodiments of the present disclosure.

FIGS. 6A and 6B illustrate operational capabilities of the circuit 500 or similar circuits depicted and described herein. Specifically, FIG. 6A illustrates the input impedance 604 of the impedance modulator 408 or circuit 500. At a low power region, the impedance 604 is at a high and pure resistive region. The impedance 604 moves to capacitive region in a certain power region, and the resistance of the impedance 604 decreases at the same time. Also, the reactance, which is arranged in the (Equation 3), can be calculated as a capacitance. FIG. 6B illustrates the input capacitance 608 of the impedance modulator 408 or circuit 500 and shows that the input capacitance of the circuit 500 can be modulated according to the power.

Figure 7:
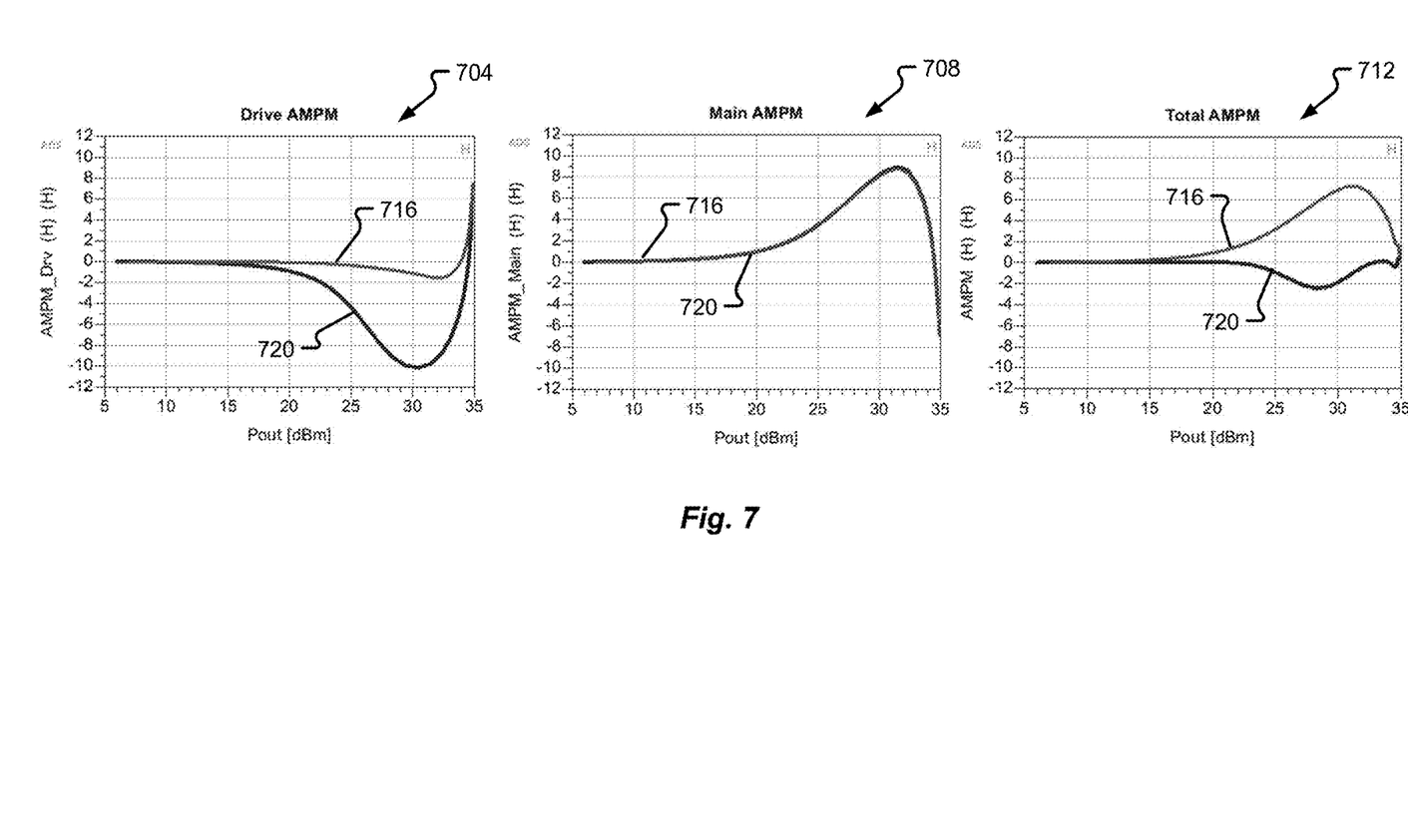
FIG. 7 depicts a comparison of amplitude modulation to phase modulation with and without an impedance modulation circuit.

The result of a pre-distorted AMPM of a power amplifier employing embodiments of the present disclosure is plotted in FIG. 7. Specifically, FIG. 7 illustrates the AMPM for the drive amplification stage 704, the AMPM for the main amplification stage 708, and the total AMPM for the power amplifier 712. Each chart illustrates a circuit performance or behavior for a traditional power amplifier 716 that does not employ an impedance modulator 408 or variable capacitance next to a circuit performance or behavior for a power amplifier 720 that does employ an impedance modulator 408 or variable capacitance in accordance with embodiments of the present disclosure. As can be seen in FIG. 7, the AMPM for the drive amplification stage 704 is significantly different for the traditional power amplifier 716 as compared to a power amplifier 720 having improvement described herein. Thus, the total AMPM for the power amplifier 712 will behave far better if the power amplifier includes an impedance modulator 408 or variable capacitance as described herein.

Conventionally, analog circuitry has an inherent problem of characteristic variation over temperature. On the other hand, embodiments of the present disclosure can enable a power amplifier and circuits provided therein to remain insensitive to the temperature change since the control voltage of this circuitry is offered from a CMOS controller 428 which can control the voltage level according to the temperature. Consequently, this circuitry can be biased at each optimum voltage over different temperatures. Also, the controllability of the bias voltage has an advantage of wide-bandwidth characteristic by means of applying an optimum bias for each frequency or frequency band.

Figure 8A:
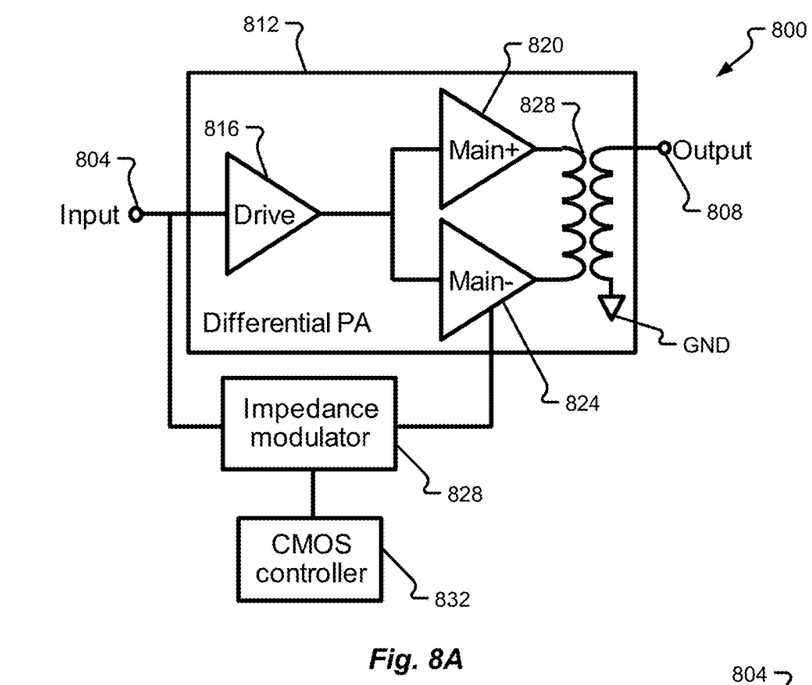
FIG. 8A is a circuit diagram depicting an illustrative differential type feedback circuit in accordance with at least some embodiments of the present disclosure.
Figure 8B:
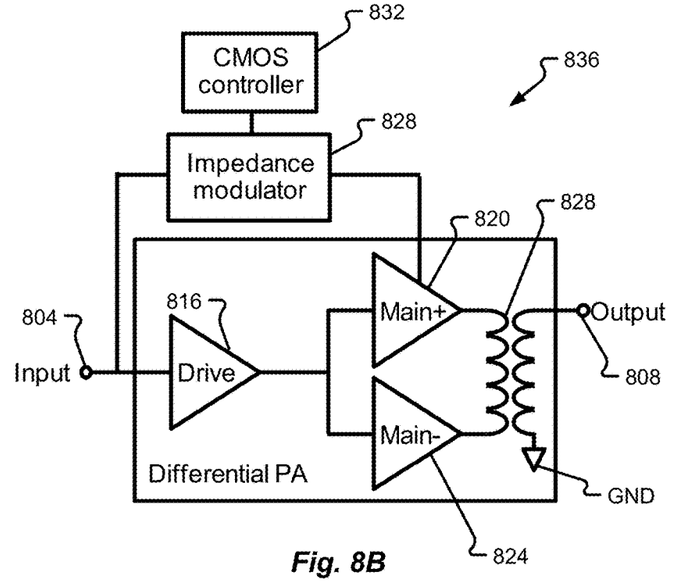
FIG. 8B is a circuit diagram depicting an alternative illustrative differential type feedback circuit in accordance with at least some embodiments of the present disclosure.

FIGS. 8A and 8B illustrate a feedback circuit 800, 836 with the power amplifier which is a differential type. With the differential power amplifier 812, embodiments described herein provide an advantage in design freedom since there are two signal paths. In other words, design and layout of an IC chip can be easily modified by the convenience of designers since only one of both signal paths is need to be connected to the impedance modulator 828 as plotted in FIGS. 8A and 8B. More specifically, the circuit 800 may include the differential power amplifier 812 connected between an input terminal 804 and output terminal 808. The input terminal 804 may be similar or identical to other input terminals (e.g., terminal 108, 204, 504, etc.) depicted and described herein and the output terminal 808 may be similar or identical to other output terminals (e.g., terminal 120, 208, etc.) depicted and described herein.

The differential power amplifier 812 may still include a drive amplifier 816, which may be similar or identical to drive amplifier 112, 212, or 404. The differential power amplifier 812 is also shown to include a positive main amplifier 820 and a negative main amplifier 824 that are coupled to the output terminal 808 via an inductive coupling 828 or transformer. As shown in FIG. 8A, the impedance modulator 828 may be connected directly to the negative main amplifier 824 and the CMOS controller 832 may operate the impedance modulator 828 as described herein. Alternatively, as shown in FIG. 8B, the impedance modulator 828 may be connected directly to the positive main amplifier 820 and the CMOS controller 832 may operate the impedance modulator 828 as described herein. In other words, the behavior of the impedance modulator 828 and CMOS controller 832 may be maintained as if the power amplifier were a linear power amplifier without departing from the scope of the present disclosure. Specifically, the impedance modulator 828 may be similar or identical to any other impedance modulator depicted and described herein (e.g., impedance modulator 124, 408, and circuit 500). Similarly, the CMOS controller 832 may be similar or identical to controller 148 or the CMOS controller 428 without departing from the scope of the present disclosure.

Figure 9:
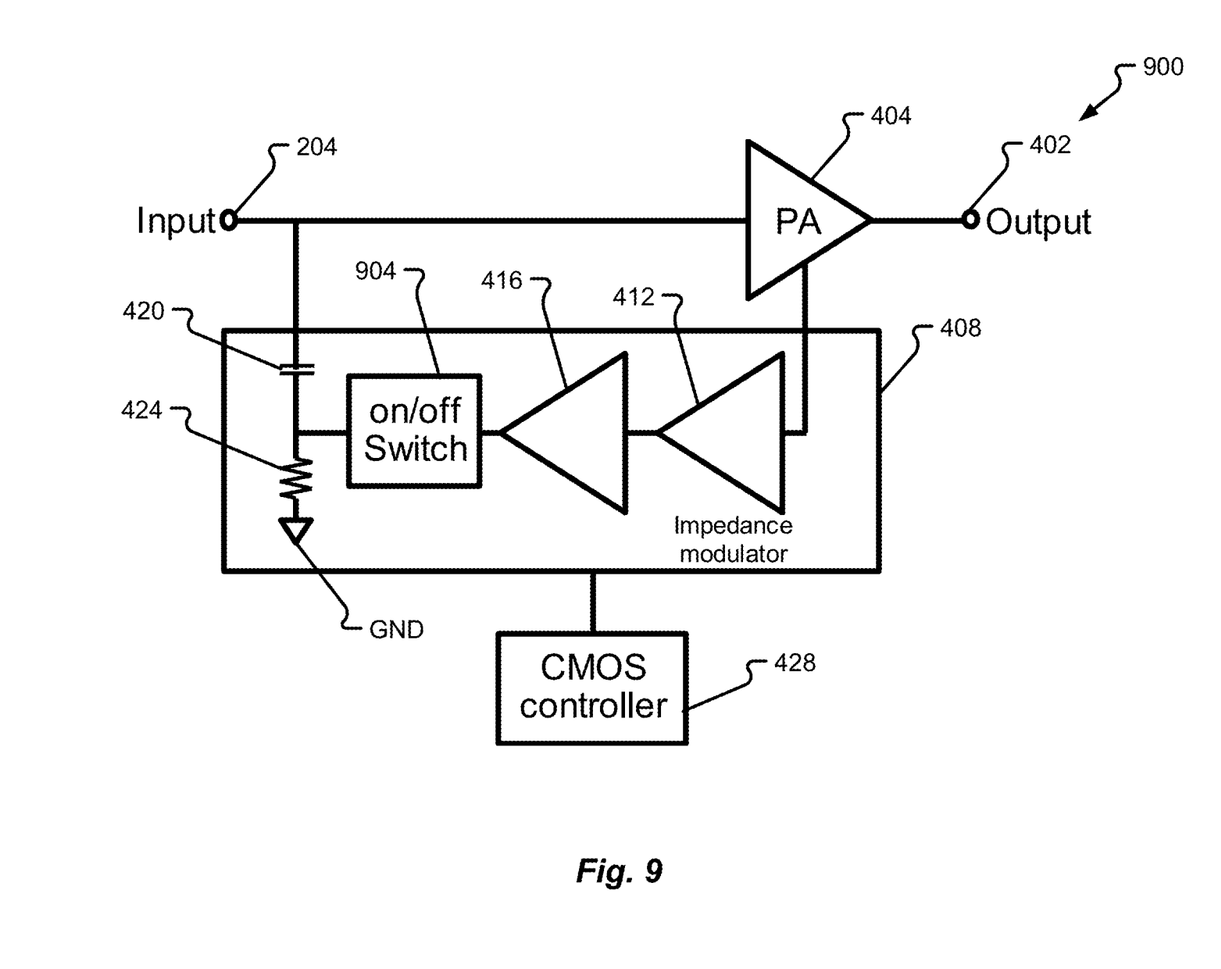
FIG. 9 is a circuit diagram depicting additional details of an impedance modulator circuit in accordance with at least some embodiments of the present disclosure.

Furthermore, the circuitry of the present disclosure can be configured to be turned off or on by using a switch 904 as depicted in FIG. 9, which illustrates a circuit 900 having similarities to circuit 400, but with the additional functionality provided by switch 904. It should be appreciated that the duplicative details of circuit 900 already described in connection with circuit 400 will not be re-described for convenience of discussion. The impedance modulator 408 may include one or many circuit components that enable an on/off switch 904 as shown in FIG. 9. In some embodiments, the switch 904 may be provided as a switching transistor. It may be useful to employ a switch 904 since the power amplifier may be configured to operate in many different modes (e.g., low power mode, high power mode, APT mode, Envelope Tracking mode, etc.) to support complex communication schemes. The switch 904 may prove particularly useful at the low power mode which may present a requirement of minimum current since active components of circuitry would add extra current on the total current flowing through the power amplifier. Thus, the switch 904 may be moveable between an on state and off state to selectively enable and disable operation of the impedance modulator 408 within circuit 900. In some embodiments, the state of the switch 904 may be controlled by the CMOS controller 428.

At least one example embodiment is directed to a power amplifier that includes: an input terminal; a drive amplifier connected to the input terminal; and an impedance modulator having a capacitance that is adjusted inversely and proportionately relative to a signal output by the drive amplifier, where the impedance modulator provides a feedback loop between an output of the drive amplifier and the input terminal.

According to one aspect, the power amplifier may further include a main stage amplifier having an input connected directly to the output of the drive amplifier, where the signal output by the drive amplifier and received at the impedance modulator is also provided to the input of the main stage amplifier.

In some embodiments, the impedance modulator further includes: a detecting amplifier that receives the signal output by the drive amplifier and that amplifies the signal output by the drive amplifier; and an inverting amplifier that receives an output of the detecting amplifier and that modulates the output of the detecting amplifier.

In some embodiments, the impedance modulator further includes: a capacitor that is shunt connected at the input terminal; and a resistor connected between ground and an output of the inverting amplifier, wherein the output of the inverting amplifier is provided to the capacitor.

In some embodiments, the power amplifier further includes a controller that provides a bias voltage to the impedance modulator. According to one aspect, the controller comprises a CMOS controller and the CMOS controller is configured to control the bias voltage based on a frequency at which input signals are received at the input terminal. In some embodiments, the frequency is variable.

According to one aspect, the capacitance is modulated based at least in part on a power input at the input terminal.

According to one aspect, the impedance modulator is provided as part of a pre-distortion circuit that corrects amplitude modulation to phase modulation (AMPM) distortion by distorting phase at the input terminal in a direction opposite to original distortion provided by an input signal received at the input terminal.

Another example embodiment provides a power amplification circuit that includes: an input terminal; an output terminal; a drive amplifier having an input connected to the input terminal; a main stage amplifier having an input connected to an output of the drive amplifier and having an output connected to the output terminal; and an impedance modulator having a capacitance that is adjusted inversely and proportionately relative to a signal output by the drive amplifier, where the impedance modulator is connected between the drive amplifier and main stage amplifier and further provides a feedback loop between the output of the drive amplifier and the input terminal.

According to one aspect, the impedance modulator further includes: a detecting amplifier that receives the signal output by the drive amplifier and that amplifies the signal output by the drive amplifier; and an inverting amplifier that receives an output of the detecting amplifier and that modulates the output of the detecting amplifier.

According to one aspect, the impedance modulator further includes: a capacitor that is shunt connected at the input terminal; and a resistor connected between ground and an output of the inverting amplifier, where the output of the inverting amplifier is provided to the capacitor.

According to one aspect, the power amplification circuit may further include a switching transistor configured to selectively turn the impedance modulator on or off depending upon a state of the switching transistor. In some embodiments, the switching transistor is connected between the inverting amplifier and the capacitor.

According to one aspect, the power amplification circuit further includes a controller that provides a bias voltage to the impedance modulator. In some embodiments, the controller comprises a CMOS controller and the CMOS controller is configured to adjust the bias voltage based on a temperature measured in proximity to the CMOS controller.

According to one aspect of the present disclosure, the impedance modulator is provided as part of a pre-distortion circuit that corrects amplitude modulation to phase modulation (AMPM) distortion by distorting phase at the input terminal in a direction opposite to original distortion provided by an input signal received at the input terminal.

Another example embodiment provides a circuit that includes: a detecting amplifier that receives a signal output by a drive amplifier and that amplifies the signal output by the drive amplifier; an inverting amplifier that receives an output of the detecting amplifier and that modulates the output of the detecting amplifier; and a capacitor having a capacitance that is adjusted inversely relative to the signal output by the drive amplifier, where the capacitor is shunt connected to an input of the drive amplifier.

According to one aspect, the circuit further includes: a main stage amplifier having an input connected to an output of the drive amplifier and having an output connected to an output terminal; and a CMOS controller configured to control a bias voltage provided between the inverting amplifier and the detecting amplifier based on a frequency at which input signals are received at the input of the drive amplifier.

According to one aspect, the circuit further includes: a switch connected between the capacitor and inverting amplifier and that selectively enables or disables current from flowing between the capacitor and the inverting amplifier.

Specific details were given in the description to provide a thorough understanding of example embodiments. However, it will be understood by one of ordinary skill in the art that example embodiments may be practiced without these specific details. In other instances, well-known circuits, processes, algorithms, structures, and techniques may be shown without unnecessary detail in order to avoid obscuring example embodiments.

While illustrative embodiments have been described in detail herein, it is to be understood that inventive concepts may be otherwise variously embodied and employed, and that the appended claims are intended to be construed to include such variations, except as limited by the prior art.

What is claimed is:

1. A power amplifier, comprising:
   an input terminal;
   a drive amplifier connected to the input terminal;
   an impedance modulator having a capacitance that is adjusted inversely and proportionately relative to a signal output by the drive amplifier, wherein the impedance modulator provides a feedback loop between an output of the drive amplifier and the input terminal; and a controller that provides a bias voltage to the impedance modulator.

2. The power amplifier of claim 1, further comprising:
a main stage amplifier having an input connected directly to the output of the drive amplifier, wherein the signal output by the drive amplifier and received at the impedance modulator is also provided to the input of the main stage amplifier.

3. The power amplifier of claim 2, wherein the impedance modulator further comprises:
a detecting amplifier that receives the signal output by the drive amplifier and that amplifies the signal output by the drive amplifier; and
an inverting amplifier that receives an output of the detecting amplifier and that modulates the output of the detecting amplifier.

4. The power amplifier of claim 3, wherein the impedance modulator further comprises:
a capacitor that is shunt connected at the input terminal; and
a resistor connected between ground and an output of the inverting amplifier, wherein the output of the inverting amplifier is provided to the capacitor.

5. The power amplifier of claim 1 wherein the controller comprises a CMOS controller and wherein the CMOS controller is configured to control the bias voltage based on a frequency at which input signals are received at the input terminal.

6. The power amplifier of claim 5, wherein the frequency is variable.

7. The power amplifier of claim 1, wherein the capacitance is modulated based at least in part on a power input at the input terminal.

8. The power amplifier of claim 1, wherein the impedance modulator is provided as part of a pre-distortion circuit that corrects amplitude modulation to phase modulation (AMPM) distortion by distorting phase at the input terminal in a direction opposite to original distortion provided by an input signal received at the input terminal.

9. A power amplification circuit, comprising:
an input terminal;
an output terminal;
a drive amplifier having an input connected to the input terminal;
a main stage amplifier having an input connected to an output of the drive amplifier and having an output connected to the output terminal;
an impedance modulator having a capacitance that is adjusted inversely and proportionately relative to a signal output by the drive amplifier, wherein the impedance modulator is connected between the drive amplifier and the main stage amplifier and further provides a feedback loop between the output of the drive amplifier and the input terminal; and
a controller that provides a bias voltage to the impedance modulator.

10. The power amplification circuit of claim 9, wherein the impedance modulator further comprises:
a detecting amplifier that receives the signal output by the drive amplifier and that amplifies the signal output by the drive amplifier; and
an inverting amplifier that receives an output of the detecting amplifier and that modulates the output of the detecting amplifier.

11. The power amplification circuit of claim 10, wherein the impedance modulator further comprises:
a capacitor that is shunt connected at the input terminal; and
a resistor connected between ground and an output of the inverting amplifier, wherein the output of the inverting amplifier is provided to the capacitor.

12. The power amplification circuit of claim 11, further comprising:
a switching transistor configured to selectively turn the impedance modulator on or off depending upon a state of the switching transistor.

13. The power amplification circuit of claim 12, wherein the switching transistor is connected between the inverting amplifier and the capacitor.

14. The power amplification circuit of claim 9, wherein the controller comprises a CMOS controller and wherein the CMOS controller is configured to adjust the bias voltage based on a temperature measured in proximity to the CMOS controller.

15. The power amplification circuit of claim 9, wherein the impedance modulator is provided as part of a pre-distortion circuit that corrects amplitude modulation to phase modulation (AMPM) distortion by distorting phase at the input terminal in a direction opposite to original distortion provided by an input signal received at the input terminal.

16. A circuit, comprising:
a detecting amplifier that receives a signal output by a drive amplifier and that amplifies the signal output by the drive amplifier;
an inverting amplifier that receives an output of the detecting amplifier and that modulates the output of the detecting amplifier; and
a capacitor having a capacitance that is adjusted inversely relative to the signal output by the drive amplifier, wherein the capacitor is shunt connected to an input of the drive amplifier.

17. The circuit of claim 16, further comprising:
a main stage amplifier having an input connected to an output of the drive amplifier and having an output connected to an output terminal; and
a CMOS controller configured to control a bias voltage provided between the inverting amplifier and the detecting amplifier based on a frequency at which input signals are received at the input of the drive amplifier.

18. The circuit of claim 16, wherein an output of the inverting amplifier is provided to the capacitor.

19. The circuit of claim 18, further comprising:
a switch connected between the capacitor and the inverting amplifier and that selectively enables or disables current from flowing between the capacitor and the inverting amplifier.

20. The circuit of claim 16, further comprising a resistor connected between ground and an output of the inverting amplifier.

* * * * *